United States Patent
Potens et al.

(10) Patent No.: US 9,258,921 B1
(45) Date of Patent: Feb. 9, 2016

(54) SYSTEMS AND METHODS FOR SECURING ELECTRICAL RECEPTACLES IN A USER DEVICE

(71) Applicant: Amazon Technologies, Inc., Reno, NV (US)

(72) Inventors: Brandon Michael Potens, Cambell, CA (US); Joshua Paul Davies, Fremont, CA (US); Andrew McIntyre, San Francisco, CA (US); Angel Wilfredo Martinez, Cupertino, CA (US)

(73) Assignee: Amazon Technologies, Inc., Reno, NV (US)

( * ) Notice: Subject to any disclaimer, the term of this patent is extended or adjusted under 35 U.S.C. 154(b) by 313 days.

(21) Appl. No.: 13/789,003

(22) Filed: Mar. 7, 2013

(51) Int. Cl.
  *H05K 7/10* (2006.01)
  *G06F 1/18* (2006.01)

(52) U.S. Cl.
  CPC . *H05K 7/10* (2013.01); *G06F 1/184* (2013.01)

(58) Field of Classification Search
  CPC ............... G06F 1/1613; G06F 1/1656; G06F 1/181–1/186; H05K 7/10; H01R 23/6806
  USPC ........ 361/679.01, 679, 2, 752, 799, 807, 808; 174/50.52, 50.54, 51, 563; 439/607.13, 439/607.18, 607.31, 607.36
  See application file for complete search history.

(56) References Cited

U.S. PATENT DOCUMENTS

| | | | |
|---|---|---|---|
| 6,295,210 B1 * | 9/2001 | Lanzone et al. | 361/799 |
| 8,767,406 B2 * | 7/2014 | Otani | 361/752 |
| 2003/0198014 A1 * | 10/2003 | Murayama | 361/685 |

* cited by examiner

*Primary Examiner* — Tuan T Dinh
*Assistant Examiner* — Mukund G Patel
(74) *Attorney, Agent, or Firm* — Sutherland Asbill & Brennan LLP

(57) ABSTRACT

This disclosure relates to systems and methods for securing a port component of a user that receives a connection component to a remote device. The port component may be secured by a docking component that may include compressible features that apply a force to the port component to insure proper alignment or orientation to receive the connection component.

19 Claims, 7 Drawing Sheets

SYSTEMS AND METHODS FOR SECURING ELECTRICAL RECEPTACLES IN A USER DEVICE

BACKGROUND

An electronic device may include mechanical connections that enable an electrical connection to another electronic device. The mechanical connection may be incomplete or not fully engaged to enable the electrical connection. The incomplete connection may occur for a variety of reasons, but being able to manufacture an electronic device with a mechanical connection that performs consistently may be desirable.

Figure 1:
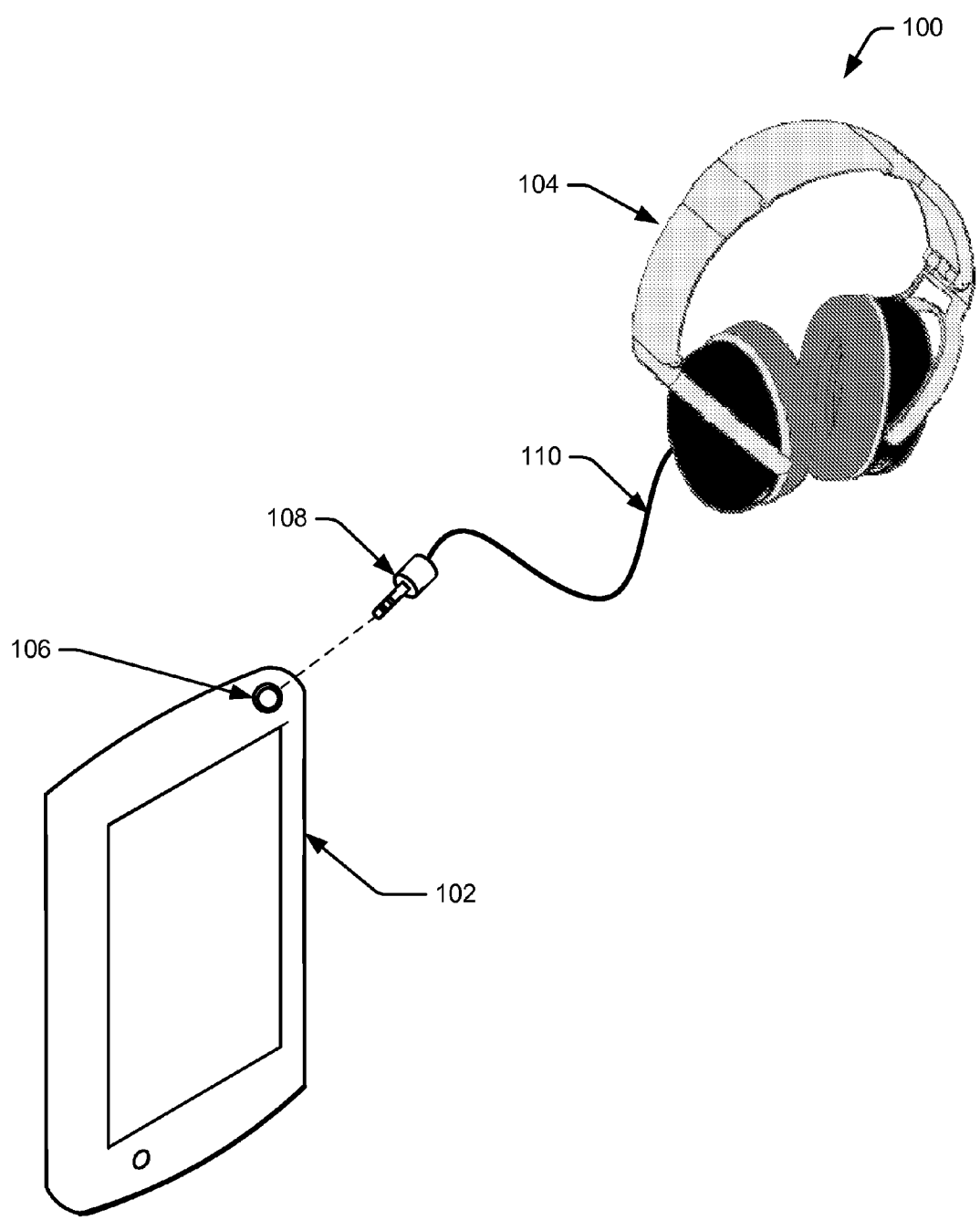
FIG. 1 illustrates a system including two or more electronic devices that are coupled together to enable electrical communication between the two or more electronic devices in accordance with one or more embodiments of the disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Described herein are devices and apparatuses for securing electrical connection receptacles in an electronic device that may include, but is not limited to, tablets, computers, laptops, or phones. The electronic device may include several electrical connection receptacles to connect or communicate with other electronics devices or power sources. The electrical connection receptacles may enable, but are not limited to, power, information, audio, or visual connections between the electronic device and other remote sources or electronic devices.

Broadly, the electrical connection receptacles may include mechanical components that may be able to receive and secure mechanical connectors that may enable electrical communication between the electronic device and the remote sources or other electronic devices. The receiving mechanical component may be secured in a position that enables the proper alignment or orientation to receive the incoming mechanical component. The receiving and incoming components may be coupled to each other to enable an electrical connection between the two components.

The receiving and incoming mechanical components may be designed and manufactured to agreed specifications. However, a certain amount of error or tolerancing may vary the size or shape of the mechanical components. Also, the position of the receiving mechanical component within the electronic device may also be exacerbated by the manufacturing errors or may introduce additional variance on its own. For example, the placement of the receiving mechanical component in the electronic device may introduce alignment or orientation errors that may not enable a consistent electrical connection with the incoming mechanical component.

In one embodiment, the receiving mechanical component may be forced into a position within the electronic device that aligns or orients the receiving mechanical component to increase the likelihood of a consistent electrical connection with the incoming mechanical component. A docking component may secure the receiving mechanical component within the electronic device by restricting the movement or placement of the receiving mechanical component. The docking component may include a recessed area to accept a portion of the receiving mechanical component. Compressible components, within the recessed area, may secure the receiving mechanical component in one or more directions of movement. In one specific embodiment, the compressible components may be aligned to restrict the movement or placement of the receiving mechanical component in a single direction (e.g., x-axis). In this instance, the receiving mechanical component may be placed flush against an interior surface of the electronic device that may include a pass-through (e.g., hole) for the incoming mechanical component. In this way, the receiving mechanical component is more likely to obtain or maintain a viable electrical connection with the incoming mechanical component. In another specific embodiment, the incoming mechanical component may be an audio jack for a pair of headphones that may play music that is stored on the electronic device. The receiving mechanical component may be an audio jack port that secures the audio jack to enable an electrical connection between the electronic device and the speakers in the headphones. However, the docking component may secure any type receiving mechanical component and is not limited to the audio jack embodiment. Other embodiments may include, but are not limited to, a high-definition multimedia interface (HDMI) connector, a universal serial bus (USB) connector; a serial port connector, or an Ethernet connector.

In another embodiment, the docking component may secure a receiving mechanical component in at least two directions to enable the alignment with the pass-through used by the incoming mechanical component. In this instance, the docking component may include two or more compressible components in the recessed area that restrict the movement or placement of a receiving mechanical component in two directions (e.g., x-axis, y-axis). In one specific embodiment, the recessed area may include four sides that mimic the geometry of the receiving mechanical component. The compressible components may be placed on at least one side to secure the receiving mechanical component in the x-direction and a second side to secure the receiving mechanical component in the y-direction. In another embodiment, the four sides may include two sides that are parallel to each other and another two sides that are parallel to one another. The four sides may form a square or a rectangle for the recessed area. In this embodiment, the compressible components may be placed on each of the four sides to secure the receiving mechanical component into a position that is aligned with the pass-through in the x-direction and the y-direction.

In another embodiment, the receiving mechanical component may also be secured in the z-direction by the floor of the recessed area in which the receiving mechanical component sits. The floor of the docking component may not include compressible components to provide some tolerance adjustment capability. The receiving mechanical component may be adjusted in the z-direction based on the amount of pressure that is applied to the compressible components attached to the floor of the recessed area.

In another embodiment, the receiving mechanical component may also be secured in the z-direction within the docking component by fasteners by applying force in the z-direction and pushing the receiving mechanical component into the recessed area of the docking component. In one specific embodiment, the receiving mechanical component may include a printed circuit board that provides electrical communication pathways to other components within the electronic device. The printed circuit board may be secured to the electronic device with screws. One or more compressible pads may be placed between the printed circuit board and the electronic device. The compressible pads may be compressible in the z-direction which may account for geometric variation in the manufacturing process of the receiving mechanical component and/or the docking component. In another embodiment, the compressible pads may be made of a conductive material that grounds the receiving mechanical component (e.g., printed circuit board) to the electronic device.

Illustrative System

FIG. 1 illustrates a system 100 that may include two or more electronic devices that are coupled together to enable electrical communication between the two or more electronic devices. In this specific embodiment, the system 100 may include a user device 102 and a pair of headphones 104. The user device 102 may include a receiving mechanical component 106 that may receive an incoming mechanical component 108 that is coupled to the headphones 104 by a wire 110. The receiving mechanical component 106 may include an audio jack port that may be enabled to secure the incoming mechanical component 108 or audio jack from the headphones 104.

The user device 102 may include, but is not limited to, smartphones, mobile phones, laptop computers, desktop computers, tablet computers, televisions, set-top boxes, game consoles, in-vehicle computer systems, and so forth.

The user device 102 may include one or more computer processors, a memory, and one or more network and input/output interfaces, and/or a display.

The computer processors may comprise one or more cores and may be configured to access and execute (at least in part) computer-readable instructions stored in the one or more memories. The one or more computer processors may include, without limitation: a central processing unit (CPU), a digital signal processor (DSP), a reduced instruction set computer (RISC), a complex instruction set computer (CISC), a microprocessor, a microcontroller, a field programmable gate array (FPGA), or any combination thereof. The user device 102 may also include a chipset (not shown) for controlling communications between the one or more processors and one or more of the other components of the user device 102. In certain embodiments, the user device 102 may be based on an Intel® architecture or an ARM® architecture, and the processor(s) and chipset may be from a family of Intel® processors and chipsets. The one or more processors may also include one or more application-specific integrated circuits (ASICs) or application-specific standard products (ASSPs) for handling specific data processing functions or tasks.

The network and I/O interfaces may also comprise one or more communication interfaces or network interface devices to provide for the transfer of data between the user device 102 and another device (e.g., network server) via a network (not shown). The communication interfaces may include, but are not limited to: personal area networks (PANs), wired local area networks (LANs), wireless local area networks (WLANs), wireless wide area networks (WWANs), and so forth. The user device 102 may be coupled to the network via a wired connection. However, the wireless system interfaces may include the hardware and software to broadcast and receive messages either using the Wi-Fi Direct Standard (see Wi-Fi Direct specification published in October 2010) and/or the IEEE 802.11 wireless standard (see IEEE 802.11-2007, published Mar. 8, 2007; IEEE 802.11n-2009, published October 2009), or a combination thereof. The wireless system (not shown) may include a transmitter and a receiver or a transceiver (not shown) capable of operating in a broad range of operating frequencies governed by the IEEE 802.11 wireless standards. The communication interfaces may utilize acoustic, radio frequency, optical, or other signals to exchange data between the user device 102 and another device such as an access point, a host computer, a server, a router, a reader device, and the like. The network may include, but is not limited to: the Internet, a private network, a virtual private network, a wireless wide area network, a local area network, a metropolitan area network, a telephone network, and so forth.

The one or more memories comprise one or more computer-readable storage media (CRSM). In some embodiments, the one or more memories may include non-transitory media such as random access memory (RAM), flash RAM, magnetic media, optical media, solid state media, and so forth. The one or more memories may be volatile (in that information is retained while providing power) or non-volatile (in that information is retained without providing power). Additional embodiments may also be provided as a computer program product including a transitory machine-readable signal (in compressed or uncompressed form). Examples of machine-readable signals include, but are not limited to, signals carried by the Internet or other networks. For example, distribution of software via the Internet may include a transitory machine-readable signal. Additionally, the memory may store an operating system that includes a plurality of computer-executable instructions that may be implemented by the computer processor to perform a variety of tasks to operate the interface(s) and any other hardware installed on the user device 102. The memory may also store content that may be displayed by the user device 102 or transferred to other devices (e.g., headphones) to be displayed or played by the other devices. The memory may also store content received from the other devices. The content from the other devices may be displayed, played, or used by the user device 102 to perform any necessary tasks or operations that may be implemented by the computer processor or other components in the user device 102.

The display may include, but is not limited to, a liquid crystal display, a light-emitted diode display, or an E-Ink™ display as made by E Ink Corp. of Cambridge, Mass. The display may be used to show content to a user in the form of text, images, or video. In certain instances, the display may also operate as a touch screen display that may enable the user to initiate commands or operations by touching the screen using certain finger or hand gestures.

The headphones 104 may include speakers (not shown) that may be used to play music that may be heard by a user (not shown). However, in other embodiments, the headphones 104 may be any other type of electronic device that may be connected to the user device 102. The other electronic devices may include, but are not limited to, a router, a modem, a computer, a laptop computer, a tablet computer, a phone, a desktop computer, a camera, a set-top computer, a television, a computer monitor or display, a power source, and/or a user interface device (e.g., a mouse, a trackball, a touch pad, or a keyboard). In a broad sense, the other electronic devices may be any type of device that may be electrically coupled to or connected to the user device 102 to exchange information or data.

Figure 2:
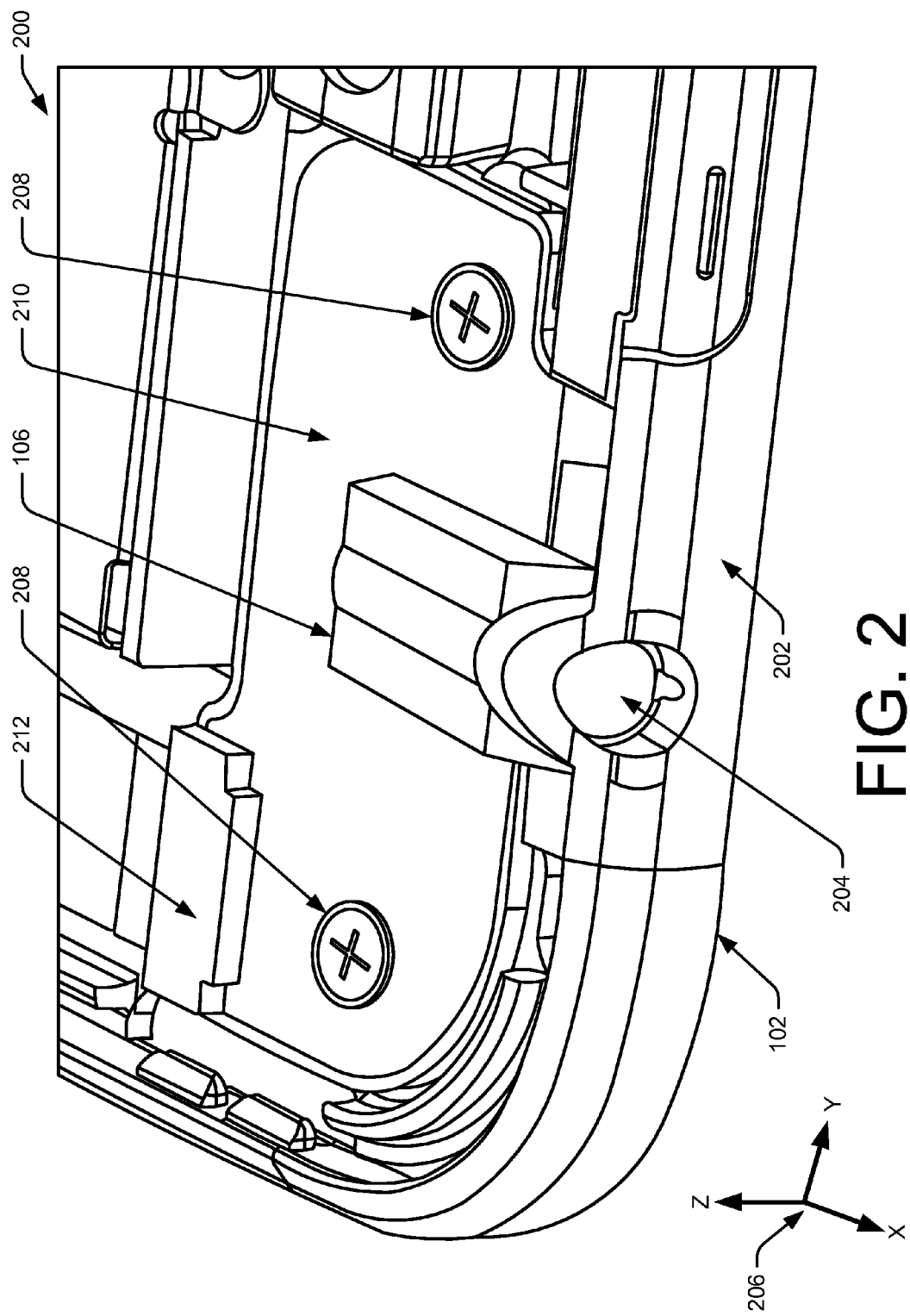
FIG. 2 illustrates a perspective view of a port or mechanical connection component of an electronic device that may enable an electrical connection with another electronic device in accordance with one or more embodiments of the disclosure.

FIG. 2 illustrates a perspective view 200 of a port or receiving mechanical component 106 of a user device 102 that may enable an electrical connection (not shown) with another electronic device (not shown). The user device 102 may include an external cover 202 that may surround at least a portion of the user device 102 to provide structural integrity and protection of the internal components. In FIG. 2, the perspective view 200 illustrates the internal components of the user device 102, such as the receiving mechanical component 106. A portion of the external cover 202 is missing so that internal components may be shown. The external cover 202 may also include a pass-through or electrical component receptacle 204 that may enable the incoming mechanical component 108 (not shown) to connect with the receiving mechanical component, or receptacle housing 106. In this embodiment, the pass-through or electrical component receptacle 204 may be aligned along the x-axis 206, as shown in FIG. 2. The y-axis and z-axis are also shown in reference to the x-axis 206. As noted above, the receiving mechanical component or receptacle housing 106 may be secured in one or more directions using the docking component (not shown) and the screws 208. A more detailed explanation of these techniques will be discussed in the descriptions of FIGS. 3-7. In this embodiment, a printed circuit board 210 may be coupled to the receiving mechanical component or electrical component receptacle, 106. The printed circuit board 210 may include electrical pathways (not shown) that may send or receive electrical communication via the electrical connection between the receiving mechanical component 106 and the incoming mechanical component 108 (not shown). The printed circuit board 210 may also have an electrical connector 212 that may establish an electrical connection with other components (e.g., processor, memory, display) in the user device 102. In this embodiment, the receiving mechanical component 106 may be secured in the z-direction by screws that couple the printed circuit board 210 to the mainframe (not shown) of the user device 102.

Figure 3:
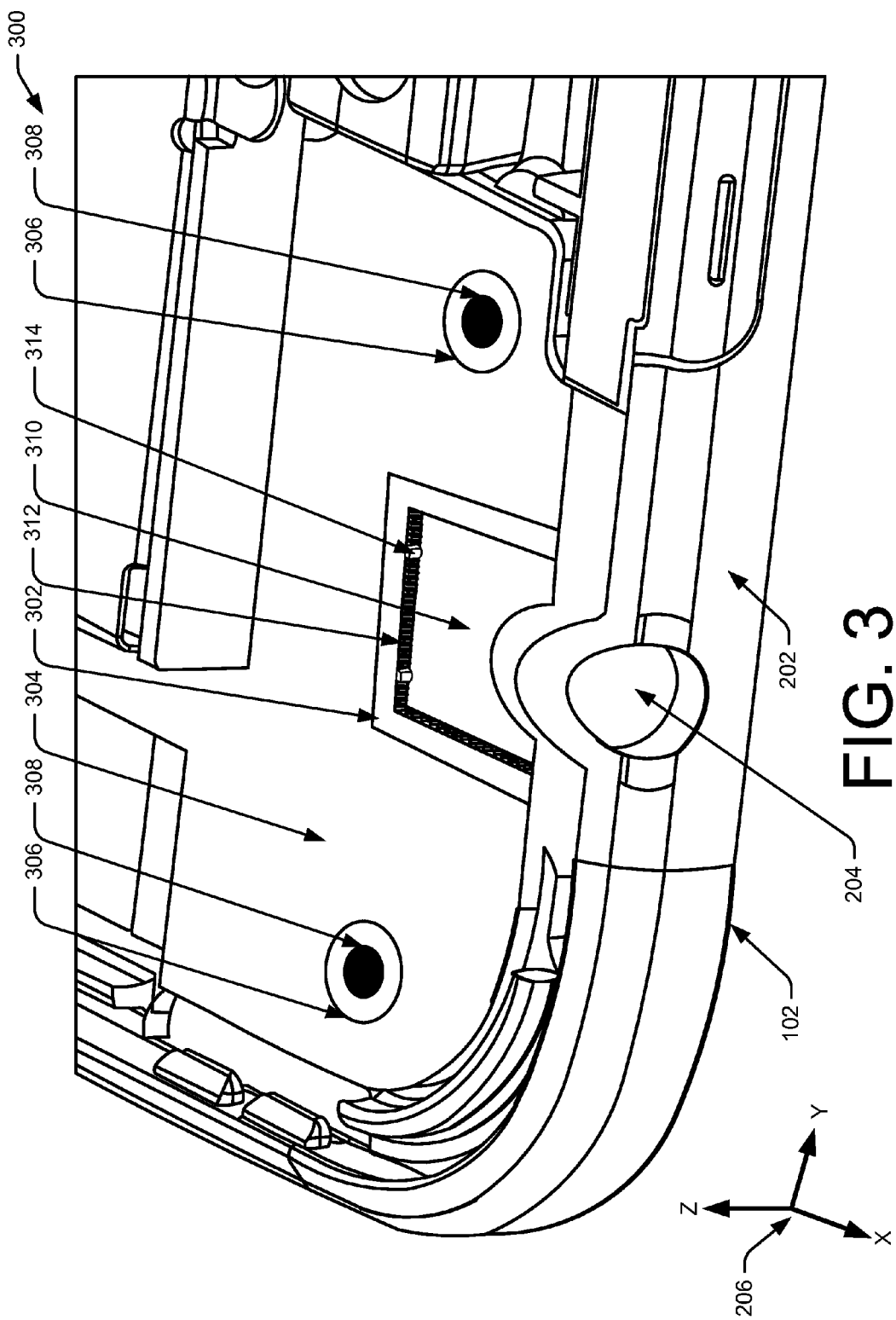
FIG. 3 illustrates a perspective view of a docking component that secures the receiving mechanical component in a position that enables a stable electrical connection to be made with the electronic device in accordance with one or more embodiments of the disclosure.

FIG. 3 illustrates a perspective view 300 of a docking component 302 that secures the receiving mechanical component 106 in a position that enables a stable electrical connection to be made with the electronic device (e.g., headphones 104). In FIG. 3, the receiving mechanical component 106 and the accompanying printed circuit board 210 have been removed from the user device 102. The docking component 302, mainframe 304, compressible pads 306, and the screw holes 308 have been exposed.

In this embodiment, the docking component 302 may be embedded into the mainframe 304 that may provide structural support for the user device 102. The internal components of the user device 102 may be coupled to the mainframe 304 to provide structural integrity or a framework for the internal components and may operate as a grounding path for the electrical components of the user device 102. In this embodiment, the mainframe 304 may secure the docking component 302 in one or more degrees of freedom (e.g., x-axis) and may align the docking component 302 with the pass-through 204 of the user device 102.

In FIG. 3, the docking component 302 may include a recessed area 310 that may be used to secure the receiving mechanical component 106. A portion of the receiving mechanical component 106 may be placed into the recessed area 310 within the confines of the four walls illustrated by the black shadowing (e.g., wall 312). The four walls may be parallel to the z-y plane, and the floor of the recessed area 310 may be parallel to the x-y plane. The four walls may be used to secure the docking component 302 in the x-y plane, and the floor of the recessed area 310 may be used to secure the docking component 302 in the z-direction. As noted above in FIG. 2, the receiving mechanical component 106 may also be secured in the z-direction by screwing the printed circuit board 210 into the mainframe 304. The printed circuit board 210 may be coupled to the receiving mechanical component 106.

In this embodiment, the docking component 302 may be rectangular in shape, but other embodiments may include other shapes or techniques to secure the receiving mechanical component 106. For example, the docking component 302 may be shaped as a circle, a pentagon, a hexagon, or a triangle.

The docking component 302 may also include compressible components 314 that may be incorporated into the walls of the recessed area 310. In this embodiment, the docking component 302 may include two compressible components along a single wall. When the receiving mechanical component 106 is placed in the recessed area 310, the compressible components 314 may apply a force to the receiving mechanical component 106 in the x-direction. For example, the compressible components 314 may push the receiving mechanical component 106 towards external cover 202 and the pass-through 204. In one instance, the receiving mechanical component 106 may be secured flush against the external cover 202 that includes the pass-through 204, as shown in FIG. 2. The receiving mechanical component 106 may include a port (e.g., an opening or a hole, as shown in FIG. 2) that may be aligned with the pass-through 204. The design or geometry of the docking component 302 may be used to facilitate the alignment, such as the location and design of the recessed area 310 and the compressible components 314. In this embodiment, two compressible components are shown in FIG. 3. However, in other embodiments, the docking component 302 may include a signal compressible component 314 or three or more compressible components along one or more walls of the recessed area 310.

In another embodiment, the user device 102 may also use compressible pads 306 to secure the printed circuit board 210 to the mainframe 304. The compressible pads 306 may account for tolerance differences in the location or manufacture of the printed circuit board 210, the mainframe 304, the docking component 302, and/or the receiving mechanical component 106. When the printed circuit board 210 is secured to the mainframe 304, as shown in FIG. 2, the compressible pads 306 may be compressed to prevent harmful stresses from developing in the printed circuit board 210 that may be transferred to the receiving mechanical component 106 and/or the docking component 302.

In another embodiment, the compressible pads 306 may be made out of a conductive material that enables the printed circuit board 210 to be grounded to the mainframe 304. The compressible pads 306 may be made of any conductive material that may maintain conductive properties when placed under compression.

Figure 4:
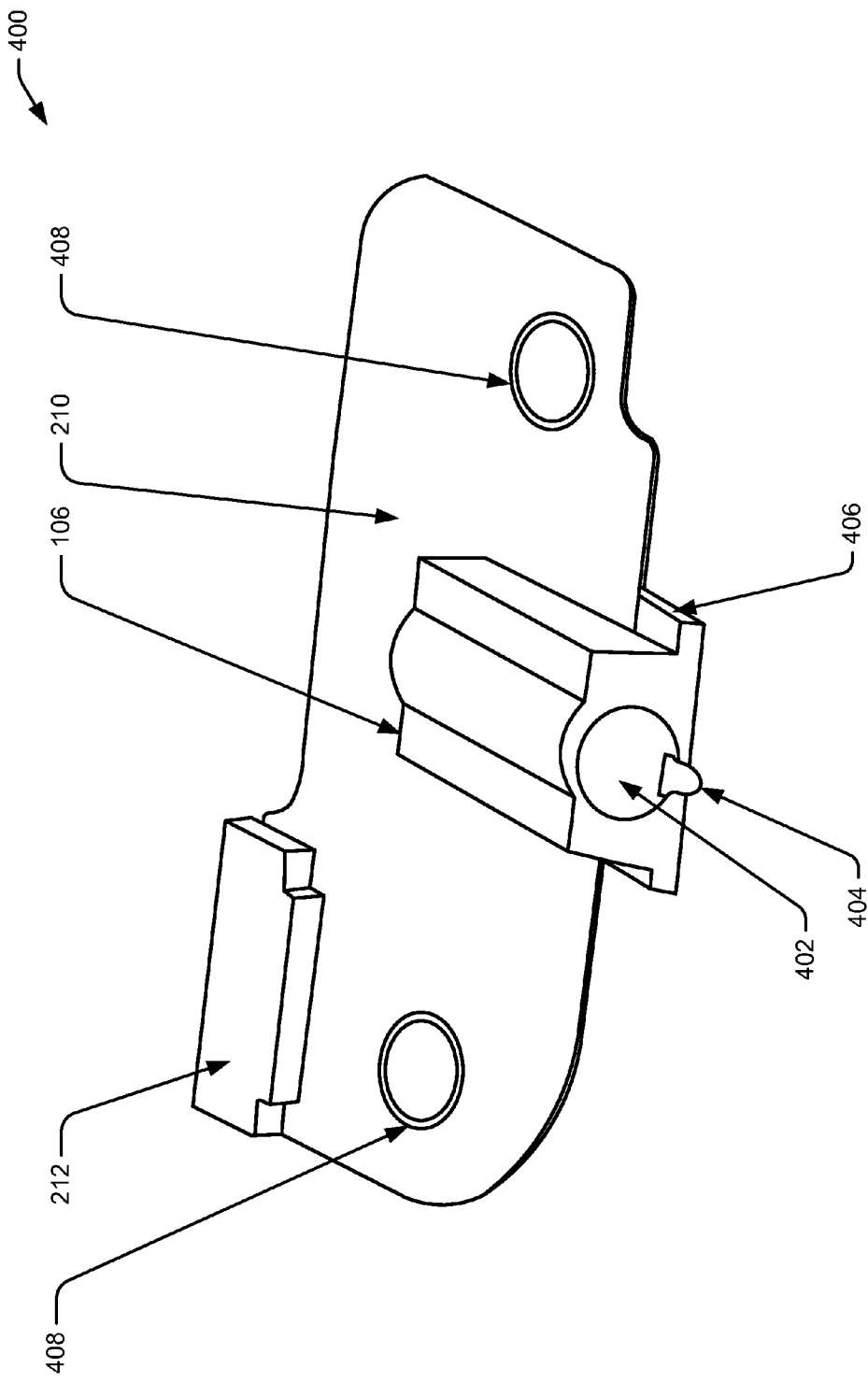
FIG. 4 illustrates a perspective view of the receiving mechanical component and the printed circuit board that was removed from user device illustrated in FIG. 2 in accordance with one or more embodiments of the disclosure.

FIG. 4 illustrates a perspective view 400 of the receiving mechanical component 106 and the printed circuit board 210 that were removed from user device 102 illustrated in FIG. 2. The receiving mechanical component 106 includes a port 402 or opening that may receive the incoming mechanical component 108 (not shown). The receiving mechanical component 106 may include internal receptacles or contact points (not shown) that may secure incoming mechanical components and/or facilitate an electrical connection that may be used to enable electrical communication between the user device 102 and the headphones 104. The receiving mechanical component 106 may include a pass-through connector 404 that may secure the incoming mechanical component 108. The pass-through connector 404 may also secure the receiving mechanical component 106 to the pass-through 204 of the user device 102.

The receiving mechanical component 106 may also include a mating surface 406 that contacts the docking component 302 to help align and secure the receiving mechanical component 106 in a position to the receive the incoming mechanical component 108. In this embodiment, the mating surface 406 conforms to the geometry of the recessed area 310 of the docking component 302. The mating surface 406 may include at least one surface that is parallel to each of the corresponding four walls of the recessed area 310.

The printed circuit board 210 may be coupled to the receiving mechanical component 106 and may include screw holes 408 that may be used to secure the printed circuit board 210 to the mainframe 304. The printed circuit board 210 may also include an electrical connector 212 that may facilitate electrical connections to other components within the user device 102.

Figure 5:
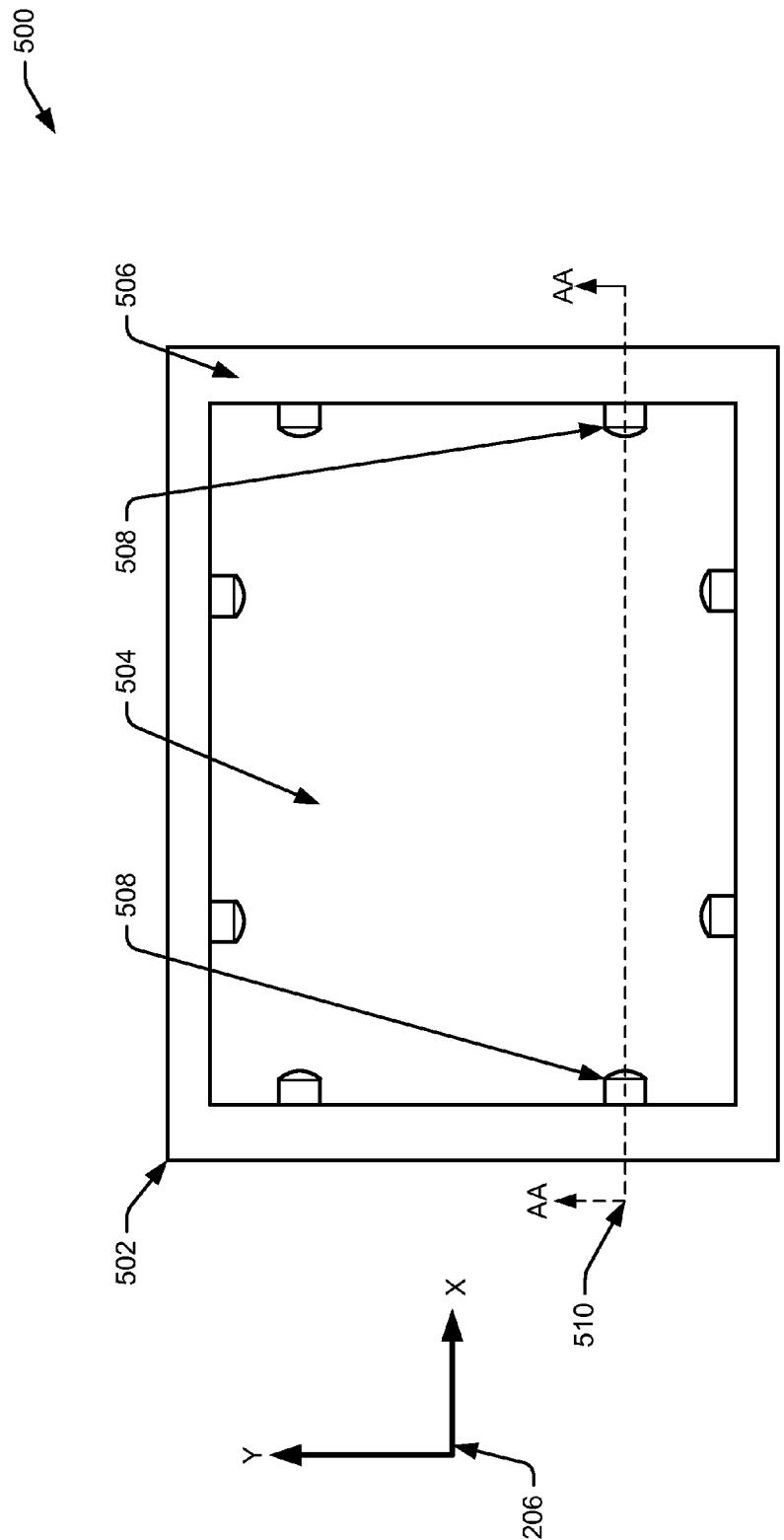
FIG. 5 illustrates a top view of the docking component that secures the receiving mechanical component within the user device in accordance with one or more embodiments of the disclosure.

FIG. 5 illustrates a top view 500 of the docking component 502 that secures the receiving mechanical component 106 within the user device 102. The top view 500 is based on a top view of the x-y plane 206 or axis of the docking component 302 in FIG. 3.

In this embodiment, the docking component 502 includes a recessed area 504 surrounded by an elevated area 506 that forms four walls that form a rectangle around the recessed area 504. The recessed area 504 may receive a portion (e.g., mating surface 406) of the receiving mechanical component 106. The mating surface 406 may be placed in contact with the compressible components 508 that may be incorporated into the walls forming the elevated area 506. In this instance, each of the four walls may include at least one compressible component 508 that may apply a force to the mating surface 406 of the receiving mechanical component 106. In one specific embodiment, the docking component 502 may include two compressible components 508 on each wall that may secure the receiving mechanical component 106 in the x-direction and y-direction. In other embodiments, the compressible components 508 may be on one wall and may secure the receiving mechanical component 106 in the x-direction and y-direction. In another embodiment, the receiving mechanical component 106 may be secured in the z-direction on the floor of the recessed area 504.

The compressible components 508 may be incorporated into the docking component 502 by a molding process in which the walls of the recessed area 504 and the compressible components 508 are created into a single piece of material. This may be illustrated by the cross-section AA 510 which will be shown in greater detail in FIG. 6. In this embodiment, the receiving mechanical component 106 may compress against the compressible components 508 that may deform or deflect to accommodate the receiving mechanical component 106. The force applied to the receiving mechanical component 106 from the compressible components 508 may push or place the receiving mechanical component 106 in a position that enables the receiving mechanical component 106 to secure the incoming mechanical component 108. In another embodiment, the compressible components 508 may be embedded into the walls of the recessed area 504. In this way, the compressible components 508 may be of a harder material than the walls of the recessed area 504. Accordingly, when the receiving mechanical component 106 is placed in the recessed area 504, the compressible components 508 may compress, and the material around the compressible components 508 may also compress when the harder compressible components are applied to the mating surface 406 of the receiving mechanical component 106.

Figure 6:
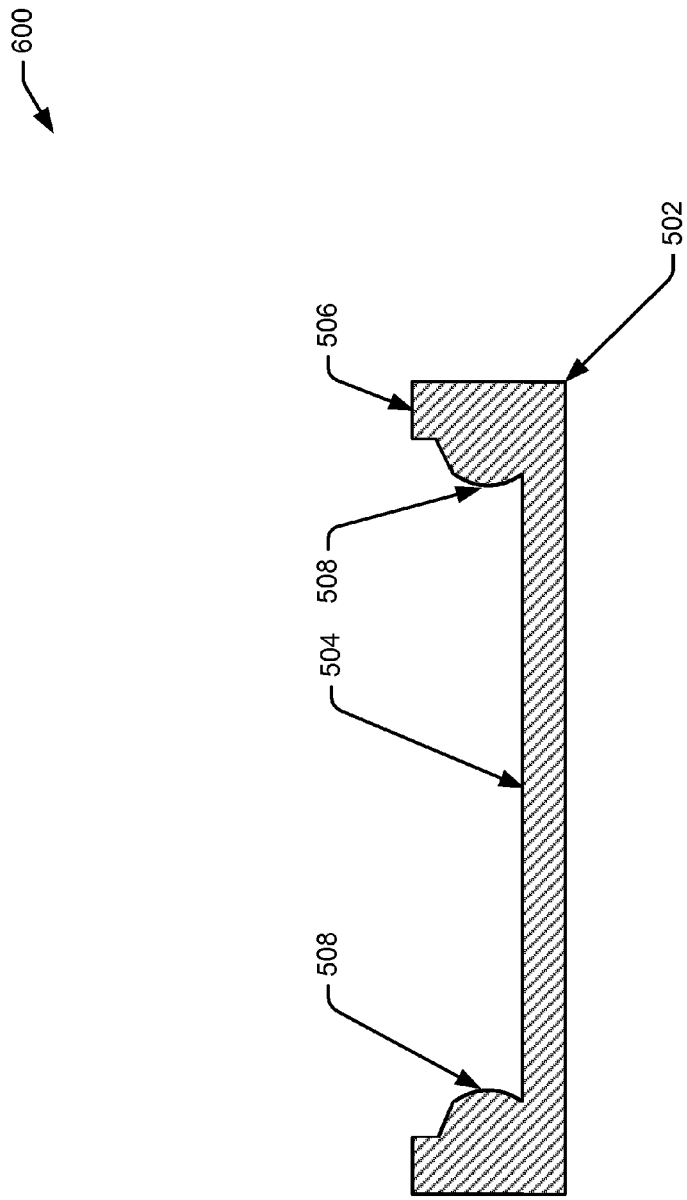
FIG. 6 illustrates a cross-sectional view of the docking component that secures the receiving mechanical component in a position to receive and secure the incoming mechanical component in accordance with one or more embodiments of the disclosure.

FIG. 6 illustrates a cross-sectional view 600 of the docking component 502 that secures the receiving mechanical component 106 (not shown) in a position to receive and secure the incoming mechanical component 108 (not shown). In this embodiment, the docking component 502 may be a single piece of material that is molded into the shape shown in FIG. 6. The docking component 502 may include the elevated area 506, the recessed area 504, and the compressible components 508 incorporated into the sidewalls of the recessed area 504.

In one embodiment, the compressible components 508 may be up to 3 mm tall, and the recessed area 504 may range from 5 mm to 7 mm deep. However, in other embodiments, the dimensions of the docking component 502 may be tailored to the dimensions of the receiving mechanical component 106.

Figure 7:
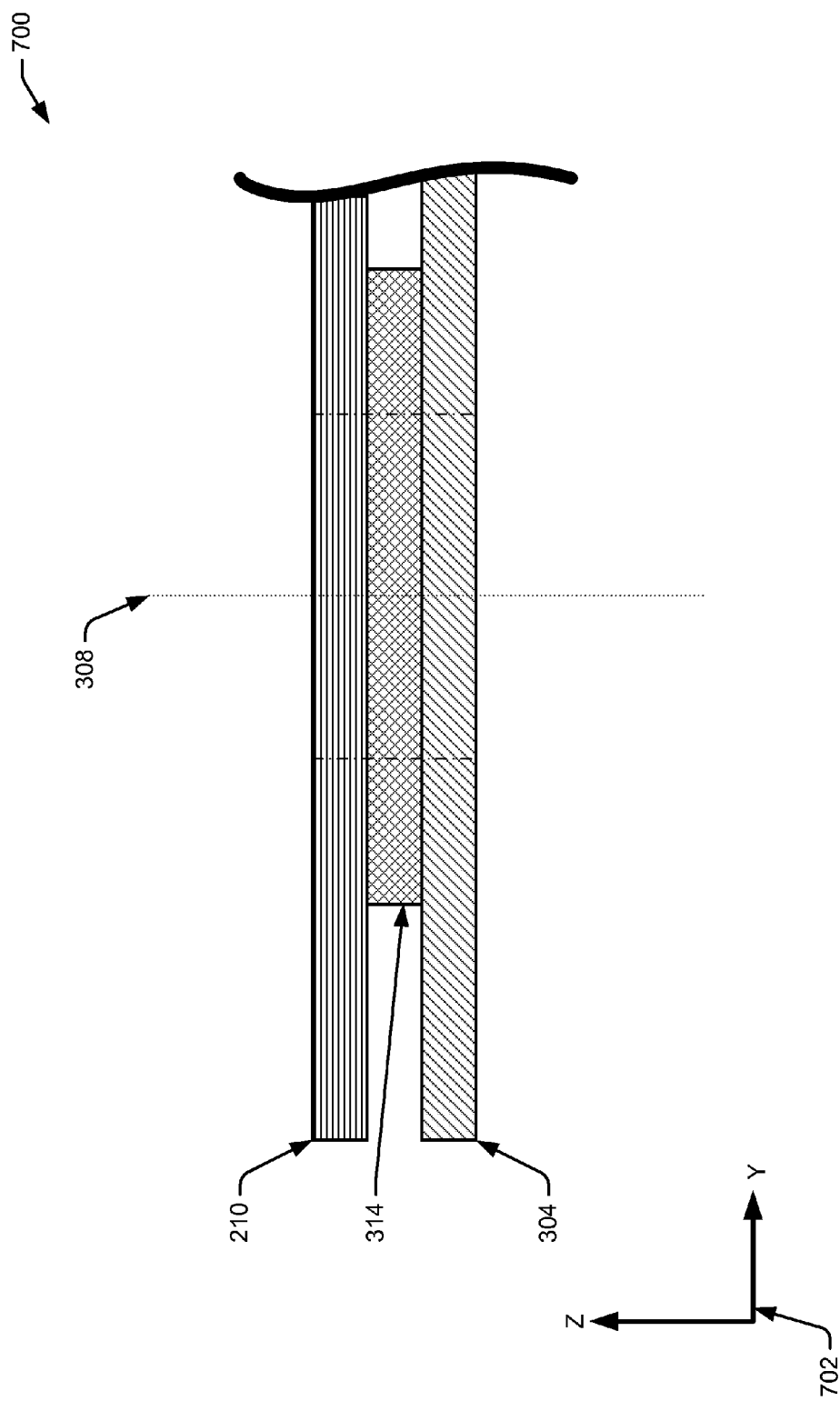
FIG. 7 illustrates a partial side view of the user device that includes the mainframe, the compressible components, and the printed circuit board in accordance with one or more embodiments of the disclosure.

FIG. 7 illustrates a partial side view 700 of the user device 102 that includes the mainframe 304, the compressible components 314, and the printed circuit board 210. The side view 700 is a close-up visualization of the aforementioned parts of the user device in the y-z plane 702. This includes the side view of a screw hole 308 before the screw is used to couple together the mainframe 304 and the printed circuit board 210.

In this embodiment, the compressible components 314 may be compressed in the z-direction to compensate for tolerance differences in the receiving mechanical component 106 and/or the docking component 302. The compressible components 314 may also reduce stress in the printed circuit board 210 and/or the mainframe 304 when they are coupled together. For example, the compressible components 314 allow greater differences in planarity between the printed circuit board 210 and the mainframe 304. Differences in planarity may have induced stress into the printed circuit board 210 and the mainframe 304 if they were coupled together without the compressible components 314. The non-uniformity in planarity may have induced more stress into the components by making one of them conform to the non-uniformity in the other. Hence, one of the components may deflect further (e.g., induce stress) to compensate for the non-uniformity in planarity. Including the compressible components 314 between the printed circuit board 210 and the mainframe 304 minimizes the amount of stress when the components are coupled together. The compressible components 314 may be compressed and may absorb or compensate for non-uniformity between the printed circuit board 210 and the mainframe 304.

CONCLUSION

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

These computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that can direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, comprising a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

What is claimed is:

1. A system, comprising:
an electrical component receptacle comprising an opening to secure a connector for a remote device that enables electrical communication with the system;
a docking component comprising a recessed area with four walls, wherein each wall of the four walls is a continuous wall;
a receptacle housing comprising a mating portion, wherein the mating portion includes four surfaces, wherein each of the four surfaces is parallel to a corresponding wall of the four walls of the recessed area;
a printed circuit board coupled to the receptacle housing, the printed circuit board being in electrical contact with the electrical component receptacle and being electrically coupled to the system; and
one or more compressible pads that are compressed between the printed circuit board and the system, the one or more compressible pads comprising conductive material that enables electrical grounding of the printed circuit board via the system;
wherein the recessed area is configured to receive the mating surface portion of the receptacle housing, and wherein each of the four walls of the recessed area are in contact with the mating portion of the receptacle housing; and
one or more compressible components extending, from one of the four walls, in the recessed area, the one or more compressible components configured to:
secure the receptacle housing in one or more directions of movement by applying pressure against the mating portion of the receptacle housing.

2. The system of claim 1, wherein the electrical component receptacle is enabled to receive one of the following: an audio jack connector, a high-definition multimedia interface connector, a universal serial bus connector; a serial port connector, a subscriber identity module connector, or an Ethernet connector.

3. The system of claim 1, wherein the receptacle housing is secured in a position that is flush with a pass-through component of the system, the pass-through component comprising the opening to receive the connector for the remote device.

4. The system of claim 1, wherein the one or more directions of movement comprise an x-axis direction and a y-axis direction, and the one or more compressible pads are compressed in a z-axis direction.

5. The system of claim 1, wherein the printed circuit board comprises an electrical conduit that facilitates electrical communication between the system and the electrical component receptacle.

6. The system of claim 1, wherein the remote device comprises at least one of the following: audio headphones, an electronic display, a printer, a phone, a speaker, or a content distribution device.

7. The system of claim 1, wherein the receptacle housing comprises a first lip extending from a first side of the receptacle housing and a second lip extending from a second side of the receptacle housing opposite the first side; and
the mating surface is positioned about the first lip and the second lip of the receptacle housing.

8. A device, comprising:
a content system that receives content from a remote device or provides the content to the remote device;

a connector component configured to secure an electrical connector that is a portion of an electrical conduit that sends or receives the content between the remote device and the content system, the connector component comprising a mating portion with at least four surfaces; and a securing component that secures the connector component in a position to receive the electrical connector, the securing component comprising:

a recessed area forming a closed rectangular shape with at least four walls, wherein each wall of the at least four walls is a continuous wall, and wherein each of the at least four walls is parallel to a corresponding surface of the at least four surfaces of the mating portion, the recessed area configured to receive the mating portion of the connector component, wherein each of the at least four walls is continuous and in contact with the mating portion; and one or more elements in the recessed area that place the connector component in a position to receive the electrical connector by applying pressure against one or more areas of the mating portion of the connector component.

9. The device of claim 8, wherein the recessed area comprises at least one substantially vertical surface that includes at least one of the elements.

10. The device of claim 8, wherein the at least four walls of the recessed area are substantially vertical surfaces having a height equal to a mating portion height, the at least four walls comprising at least one of the elements protruding from at least one of the substantially vertical surfaces.

11. The device of claim 8, wherein the at least four walls of the recessed area comprise:

a first wall and a second wall that each include at least one element to secure the electrical connector in a horizontal direction, and two horizontal surfaces that are substantially perpendicular to the first wall and the second wall, the two horizontal surfaces including at least one element to secure the electrical connector in a horizontal direction.

12. The device of claim 8, further comprising a port component comprising a hole to receive the electrical connector, and wherein the position comprises the connector component being placed against the port component.

13. The device of claim 12, wherein the connector component is placed against the port component comprises flush contact between the port component and the connector component.

14. The device of claim 8, wherein the connector component comprises a first lip extending from a first side of the connector component and a second lip extending from a second side of the connector component opposite the first side; and the mating surface is positioned about the first lip and the second lip of the connector component.

15. A device, comprising:

a content system that receives content from a remote device or provides the content to the remote device;

a connector component comprising a mating surface, the connector component configured to secure an electrical connector that is a portion of an electrical conduit that sends or receives the content between the remote device and the content system, the connector component comprising a mating portion with at least four surfaces;

a securing component that secures the connector component in a position to receive the electrical connector, the securing component comprising:

a recessed area forming a closed rectangular shape with at least four walls, wherein each respective wall of the at least four walls is a continuous wall, and wherein each of the at least four walls is parallel to a corresponding surface of the at least four surfaces of the mating portion, the recessed area configured to receive the mating portion of the connector component, wherein each of the at least four walls is continuous and in contact with the mating portion; and one or more elements in the recessed area that place the connector component in a position to receive the electrical connector by applying pressure against one or more areas of the mating portion of the connector component; and one or more conductive pads that enables an electrical pathway from the connector component to the device.

16. The device of claim 15, wherein:

the position comprises an x-axis position, a y-axis position and a z-axis position, the securing component secures the connector component in a x-axis direction and a y-axis direction, and the one or more conductive pads are compressed to provide placement compensation in the z-axis direction.

17. The device of claim 15, wherein the connector component comprises a printed circuit board that is electrically coupled to the one or more conductive pads, and the printed circuit board comprises a portion of another electrical conduit between the connector component and the device.

18. The device of claim 15, wherein the electrical pathway comprises an electrical grounding pathway from the connector component to the device.

19. The device of claim 15, wherein the connector component comprises a first lip extending from a first side of the connector component and a second lip extending from a second side of the connector component opposite the first side; and the mating surface is positioned about the first lip and the second lip of the connector component.

* * * * *